(12) United States Patent
Alpe (10) Patent No.: US 10,495,050 B2
(45) Date of Patent: Dec. 3, 2019

(54) METHOD OF CONTROLLING THE SLEW RATE OF A MOSFET AND APPARATUS THEREOF

(71) Applicant: GM GLOBAL TECHNOLOGY OPERATIONS LLC, Detroit, MI (US)

(72) Inventor: Simone Alpe, Condove (IT)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 855 days.

(21) Appl. No.: 15/136,215

(22) Filed: Apr. 22, 2016

(65) Prior Publication Data

US 2016/0315609 A1  Oct. 27, 2016

(30) Foreign Application Priority Data

Apr. 23, 2015 (GB) .................................. 1507120.2

(51) Int. Cl.
*H05B 1/02* (2006.01)
*F02P 19/00* (2006.01)
*F02P 19/02* (2006.01)
*H03K 5/04* (2006.01)
*H02J 7/00* (2006.01)
*H03K 17/16* (2006.01)

(52) U.S. Cl.
CPC ............ *F02P 19/028* (2013.01); *H02J 7/007* (2013.01); *H02J 7/0068* (2013.01); *H03K 5/04* (2013.01); *H03K 17/163* (2013.01); *H03K 2217/0063* (2013.01)

(58) Field of Classification Search
CPC ....... F02P 19/028; H03K 5/04; H03K 17/163; H03K 2217/0063; H05B 1/0236; H05B 2203/027

USPC .......................... 219/202, 205, 497, 494, 501
See application file for complete search history.

(56) References Cited

U.S. PATENT DOCUMENTS

| 7,936,189 B2 * | 5/2011 | Tumminaro ......... H03K 17/163 327/108 |
| 8,724,344 B2 * | 5/2014 | Matthews ......... H02M 3/33507 363/16 |
| 9,294,084 B1 * | 3/2016 | McIntosh ............. H03K 17/165 |
| 2004/0021498 A1 | 2/2004 | Scheikl |

(Continued)

FOREIGN PATENT DOCUMENTS

| CN | 101375499 A | 2/2009 |
| CN | 101557218 A | 10/2009 |

(Continued)

OTHER PUBLICATIONS

Great Britain Patent Office, Great Britain Search Report for Great Britain Application No. 1507120.2, dated Oct. 26, 2015.

(Continued)

*Primary Examiner* — Mark H Paschall
(74) *Attorney, Agent, or Firm* — Lorenz & Kopf, LLP (57) ABSTRACT

A method of controlling a slew rate of a MOSFET connected to a battery for supplying an electrical current to an electrical load is provided. A state transition of the MOSFET is provided and a drain-source voltage of the MOSFET is monitored. A variable current is provided through a gate of the MOSFET. A constant current is provided through the gate of the MOSFET, when the drain-source voltage of the MOSFET satisfies a predefined condition that is a function of a battery voltage.

20 Claims, 4 Drawing Sheets

(56) References Cited

U.S. PATENT DOCUMENTS

| | | |
|---|---|---|
| 2010/0327928 A1 | 12/2010 | Li et al. |
| 2011/0000901 A1* | 1/2011 | Bauer .................. F02P 19/025 219/494 |
| 2014/0266322 A1 | 9/2014 | Wang et al. |
| 2014/0361706 A1 | 12/2014 | Kulkarni et al. |

FOREIGN PATENT DOCUMENTS

| | | |
|---|---|---|
| DE | 10143432 C1 | 2/2003 |
| EP | 0864745 A1 | 9/1998 |
| JP | 2000102177 A | 4/2000 |

OTHER PUBLICATIONS

State Intellectual Property Office of the People's Republic of China, Office Action for Chinese Patent Application No. 201610262623.5 dated May 5, 2019.

* cited by examiner

METHOD OF CONTROLLING THE SLEW RATE OF A MOSFET AND APPARATUS THEREOF

CROSS-REFERENCE TO RELATED APPLICATION

This application claims priority to Great Britain Patent Application No. 1507120.0, filed Apr. 23, 2015, which is incorporated herein by reference in its entirety.

TECHNICAL FIELD

The present disclosure pertains to a method of controlling the slew rate of a Metal Oxide Semiconductor Field Effect Transistor (MOSFET) and an apparatus thereof used, in particular, to supply and control electrical loads having low resistance such as glow plugs for Diesel engines.

BACKGROUND

It is known that a MOSFET can be used to control pulse width modulation (PWM) processes where the pulse width changes are modulated based upon input provided by the MOSFET. It is also known that Diesel engines are provided with ceramic or metallic glow plugs for allowing cold-start of the engine and for optimizing combustion performance during engine operation. Glow plugs are located in a combustion chamber of the engine and are electrically connected to a voltage power source, for example a battery of the vehicle, by means of an electric switch, for example a MOSFET, controlled by means of PWM processes and driven by an electronic control unit (ECU).

One of the parameters that define the performance of MOSFET transistors is the "slew rate" of the control signals that are used to control the MOSFET. The slew rate refers to the maximum voltage change allowed per unit time. The slew rate has to be controlled when a MOSFET is used to supply an external load that has a low electrical resistance and therefore absorbs high current, such as in the case of glow plugs, otherwise the fast commutation required by pulse width modulation (PWM) processes generates radiated or conducted noise that may damage the electronic components of the circuit in violation of the Electromagnetic Compatibility (EMC) requirement.

To address this problem, it is known to use an external series resistor and an external capacitor between gate and drain of the MOSFET. A drawback of this solution, however, is that such components have to be tuned on the specific MOSFET used and its performance changes according to battery voltage.

Another known solution is to impose a constant current during all the ON-OFF and Off-ON transitions. However, this solution cannot be used for MOSFET with high gate charge, because the propagation delay becomes too long.

SUMMARY

In accordance with the present disclosure, an embodiment is provided, which improves EMC performances and, at the same time, provide a solution that is suitable for a wide set of MOSFETs, also considering that such MOSFETs may be used to control components with a high gate charge. An embodiment of the disclosure provides a method controlling a slew rate of a MOSFET, the MOSFET being connected to a battery for supplying an electrical current to an electrical load. In the method, a state transition of the MOSFET is provided and a drain-source voltage of the MOSFET is monitored. A variable current through a gate of the MOSFET is provided, and a constant current is provided through the gate of the MOSFET, when the drain-source voltage of the MOSFET satisfies a predefined condition that is a function of a battery voltage. An advantage of this embodiment is that it improves EMC performances because its performance is ratiometric with respect to the battery voltage in case of an OFF-ON transition of the MOSFET and also in case of an ON-OFF transition of the MOSFET.

This embodiment is ratiometric with battery voltage supply because the transition is decided by monitoring the drain-source MOSFET voltage and comparing it with a threshold generated from battery voltage itself. Moreover this solution does not depend on the particular type of MOSFET employed, but on the contrary it is suitable for a wide set of MOSFET's, also considering components with a high gate charge.

According to another embodiment of the present disclosure, in an OFF-ON transition of the MOSFET, the predefined condition to be satisfied is that the drain-source voltage of the MOSFET is lower than a first threshold voltage that is a function of the battery voltage. An advantage of this embodiment is that it properly controls the slew rate of the MOSFET in an OFF-ON transition of the MOSFET.

According to still another embodiment of the present disclosure, the first threshold voltage is equal to VBAT/4 or in words one-fourth of the battery voltage. An advantage of this embodiment is that the transition between the steps of the method is decided by a parameter that is proportional to the battery voltage, allowing this solution to be ratiometric with battery voltage supply.

According to another embodiment of the present disclosure, the constant current through the gate of the MOSFET is provided, in an OFF-ON transition of the MOSFET, by employing a first current generator connected to the gate of the MOSFET. An advantage of this embodiment is that the first current generator can act as a current mirror to provide a predefined constant current.

According to another embodiment of the present disclosure, the variable current through the gate of the MOSFET is provided by a first switch bypassing, in a closed position, the first current generator. An advantage of this embodiment is that the maximum current value is limited by a resistor of a pre-driver circuit.

According to still another embodiment of the present disclosure, in an ON-OFF transition of the MOSFET, the predefined condition to be satisfied is that the drain-source voltage of the MOSFET is greater than a second threshold voltage that is a function of the battery voltage. An advantage of this embodiment is that it properly controls the slew rate of the MOSFET in an ON-OFF transition of the MOSFET.

According to a further embodiment of the present disclosure, the second threshold voltage is equal to VBAT/6 or in words one-sixth of the battery voltage. An advantage of this embodiment is that the transition between the steps of the method is decided by a parameter that is proportional to the battery voltage, allowing this solution to be ratiometric with battery voltage supply.

According to still another embodiment of the present disclosure, the constant current through the gate of the MOSFET is provided, in an ON-OFF transition of the MOSFET, by employing a second current generator connected to the gate of the MOSFET. An advantage of this embodiment is that the second current generator can act as a current mirror absorbing a predefined constant current.

According to a further embodiment of the present disclosure, the variable current through the gate of the MOSFET is provided by a second switch bypassing, in a closed position, the second current generator. An advantage of this embodiment is that the maximum current value is limited by a resistor of a pre-driver circuit.

The method may be executed with the aid of a computer program including a program-code for carrying out the method described above, and in the form of a computer program product including the computer program. The method can be also embodied as electromagnetic signals, the signal being modulated to carry a sequence of data bits which represent a computer program to carry out all steps of the method.

According to another aspect of the present disclosure, an apparatus is provided for controlling a slew rate of a MOSFET connected to a battery for supplying an electrical current to an electrical load. The apparatus includes a sensor circuit configured to sense a state transition of the MOSFET and a monitoring circuit configured to monitor a drain-source voltage of the MOSFET. A pre-driver circuit provides a variable current through a gate of the MOSFET and a constant current through the gate of the MOSFET, when the drain-source voltage of the MOSFET satisfies a predefined condition that is a function of a battery voltage. An advantage of this aspect is that it improves EMC performances because its performance is ratiometric with respect to the battery voltage. The performance of the apparatus is ratiometric with battery voltage supply because the transition between is decided by monitoring the drain-source MOSFET voltage and comparing it with a threshold generated from battery voltage itself. Moreover this solution works properly for a wide set of MOSFET's, also considering components with a high gate charge. The circuits needed for the apparatus can be easily integrated in an ASIC solution with a limited silicon space occupation.

According to another aspect of the present disclosure, the pre-driver circuit includes a first current generator, arranged between a feeding node and a first intermediate node. An advantage of this aspect that the first current generator can act as a current mirror to provide a predefined constant current.

According to another aspect of the present disclosure, the pre-driver circuit includes a first switch bypassing, in a closed position, the first current generator. An advantage of this aspect is that the maximum current value is limited by a resistor of a pre-driver circuit.

According to a further aspect of the present disclosure, the pre-driver circuit further includes a second current generator, arranged between a second intermediate node and a ground node. An advantage of this aspect is that the second current generator can act as a current mirror absorbing a predefined constant current.

According to still another aspect of the present disclosure, the pre-driver circuit includes a second switch bypassing, in a closed position, the second current generator. An advantage of this aspect is that the maximum current value is limited by a resistor of a pre-driver circuit.

According to still another aspect of the present disclosure, the electrical load is a glow plug for a Diesel engine. An advantage of this aspect is that it operates a component having a low resistance and, consequently, a high current.

BRIEF DESCRIPTION OF THE DRAWINGS

The present disclosure will hereinafter be described in conjunction with the following drawing figures, wherein like numerals denote like elements.

DETAILED DESCRIPTION

The following detailed description is merely exemplary in nature and is not intended to limit the invention or the application and uses of the invention. Furthermore, there is no intention to be bound by any theory presented in the preceding background of the invention or the following detailed description.

Figure 1:
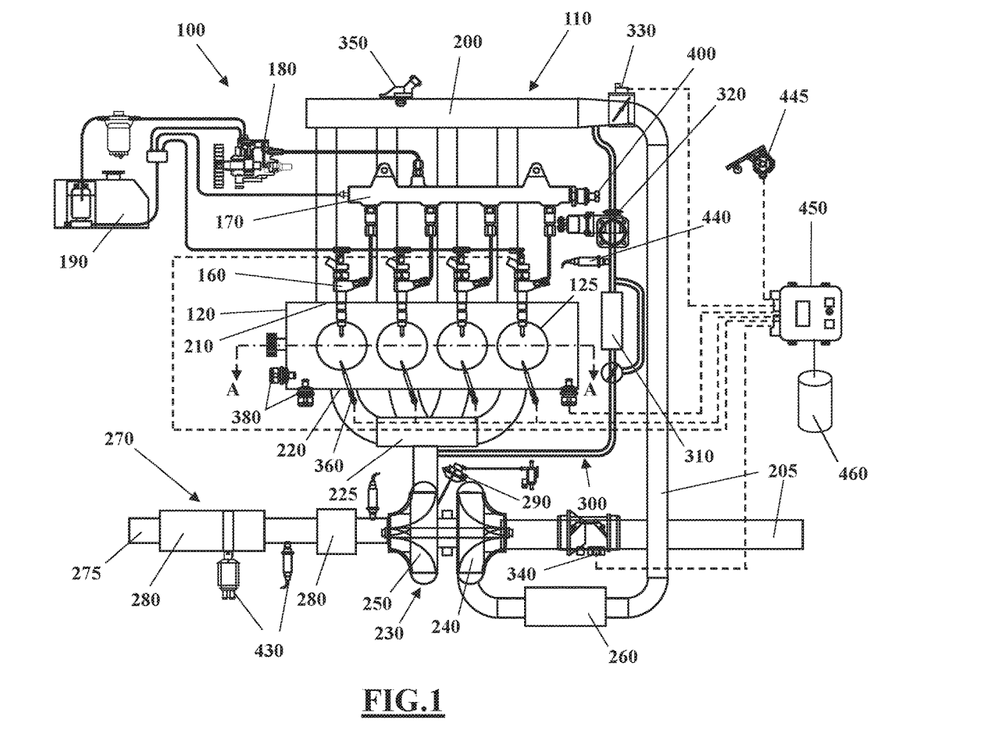
FIG. 1 shows an automotive system.
Figure 2:
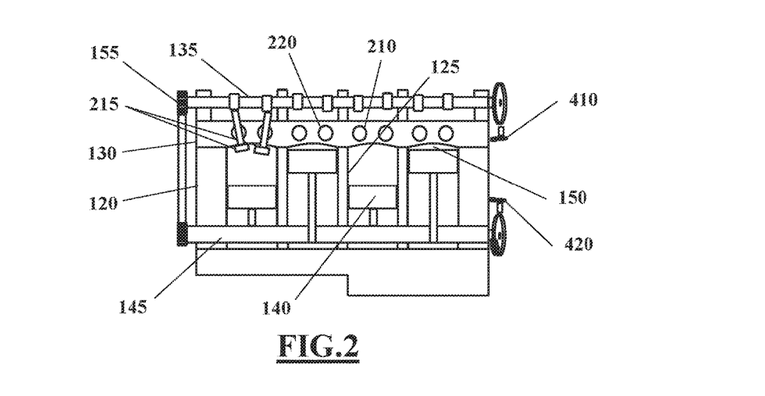
FIG. 2 is a cross-section of an internal combustion engine belonging to the automotive system of FIG. 1.

Some embodiments may include an automotive system 100, as shown in FIGS. 1 and 2, that includes an internal combustion engine (ICE) 110 having an engine block 120 defining at least one cylinder 125 having a piston 140 coupled to rotate a crankshaft 145. A cylinder head 130 cooperates with the piston 140 to define a combustion chamber 150. A fuel and air mixture (not shown) is disposed in the combustion chamber 150 and ignited, resulting in hot expanding exhaust gasses causing reciprocal movement of the piston 140. The fuel is provided by at least one fuel injector 160 and the air through at least one intake port 210. The fuel is provided at high pressure to the fuel injector 160 from a fuel rail 170 in fluid communication with a high pressure fuel pump 180 that increases the pressure of the fuel received from a fuel source 190. Each of the cylinders 125 has at least two valves 215, actuated by a camshaft 135 rotating in time with the crankshaft 145. The valves 215 selectively allow air into the combustion chamber 150 from the port 210 and alternately allow exhaust gases to exit through a port 220. In some examples, a cam phaser 155 may selectively vary the timing between the camshaft 135 and the crankshaft 145.

In the combustion chamber 150 is located a glow plug 360 acting as a heating element which is electrically activated for cold starting of the engine and also for improving the combustion performance within the combustion chamber. The glow plug 360 is electrically connected to a voltage power source, for example a battery of the automotive system, and is controlled to have an on state and an off state. According to a possible embodiment, the on/off states of the glow plug 360 are controlled by an electronic control unit (ECU) intended to control a switch. As it will be disclosed in more detail later, according to a possible embodiment, a switch, such as a MOSFET 560, can be provided to control the on/off states of the glow plug 360.

The air may be distributed to the air intake port(s) 210 through an intake manifold 200. An air intake duct 205 may provide air from the ambient environment to the intake manifold 200. In other embodiments, a throttle body 330 may be provided to regulate the flow of air into the manifold 200. In still other embodiments, a forced air system such as a turbocharger 230, having a compressor 240 rotationally coupled to a turbine 250, may be provided. Rotation of the compressor 240 increases the pressure and temperature of the air in the duct 205 and manifold 200. An intercooler 260 disposed in the duct 205 may reduce the temperature of the air. The turbine 250 rotates by receiving exhaust gases from an exhaust manifold 225 that directs exhaust gases from the exhaust ports 220 and through a series of vanes prior to expansion through the turbine 250. The exhaust gases exit the turbine 250 and are directed into an exhaust system 270. This example shows a variable geometry turbine (VGT) with a VGT actuator 290 arranged to move the vanes to alter the flow of the exhaust gases through the turbine 250. In other embodiments, the turbocharger 230 may be fixed geometry and/or include a waste gate.

The exhaust gases of the engine are directed into an exhaust system 270. The exhaust system 270 may include an exhaust pipe 275 having one or more exhaust aftertreatment devices 280. The aftertreatment devices may be any device configured to change the composition of the exhaust gases. Some examples of aftertreatment devices 280 include, but are not limited to, catalytic converters (two and three way), oxidation catalysts, lean $NO_x$ traps, hydrocarbon adsorbers, selective catalytic reduction (SCR) systems, and particulate filters. Other embodiments may include an exhaust gas recirculation (EGR) system 300 coupled between the exhaust manifold 225 and the intake manifold 200. The EGR system 300 may include an EGR cooler 310 to reduce the temperature of the exhaust gases in the EGR system 300. An EGR valve 320 regulates a flow of exhaust gases in the EGR system 300.

The automotive system 100 may further include an electronic control unit (ECU) 450 in communication with one or more sensors and/or devices associated with the ICE 110 and with a memory system, or data carrier 460, and an interface bus. The ECU 450 may receive input signals from various sensors configured to generate the signals in proportion to various physical parameters associated with the ICE 110. The sensors include, but are not limited to, a mass airflow and temperature sensor 340, a manifold pressure and temperature sensor 350, a combustion pressure sensor that may be integral within the glow plugs 360, coolant and oil temperature and level sensors 380, a fuel rail pressure sensor 400, a cam position sensor 410, a crank position sensor 420, exhaust pressure and temperature sensors 430, an EGR temperature sensor 440, and an accelerator pedal position sensor 445. Furthermore, the ECU 450 may generate output signals to various control devices that are arranged to control the operation of the ICE 110, including, but not limited to, the fuel injectors 160, the throttle body 330, the EGR Valve 320, a Variable Geometry Turbine (VGT) actuator 290, and the cam phaser 155. Note, dashed lines are used to indicate communication between the ECU 450 and the various sensors and devices, but some are omitted for clarity.

Figure 3:
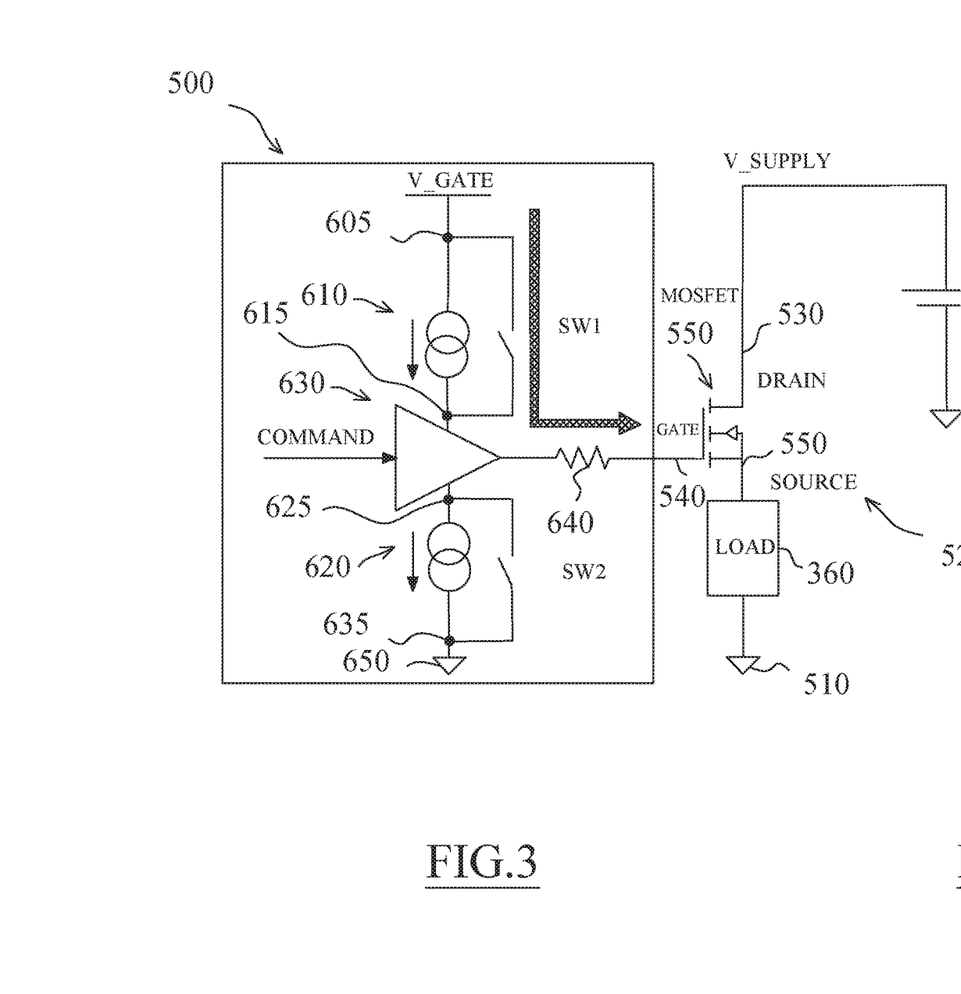
FIG. 3 is a schematic of a circuit for a MOSFET used to supply an electrical load in an OFF-ON transition.

Referring now to FIG. 3, a schematic of a circuit for a MOSFET 560 used to supply an electrical load in an OFF-ON transition is represented. The electrical load may be, for example, a glow plug 360 for a Diesel engine. According to FIG. 3, glow plug 360, a MOSFET 560 and a battery 600 are serially connected in sequence, the MOSFET 560 being part of control circuit 520 of the glow plug 360, the glow plug 360 being also connected to a ground pole 510. The MOSFET 560 has three terminals. These three terminals are a drain 530, a gate 540 and a source 550. The source 550 is connected to an input terminal of the glow plug 360, the gate 540 is connected to the pre-driver circuit 500, which will be better explained in the following description, and the drain 530 is connected to the battery 600.

As is known in the art, the glow plug 360 has a resistive heating coil that includes a regulating coil and a heating coil for raising temperature of the fresh air inside the combustion chamber 150. These coils heat up the fresh air for ignition with injected diesel. The MOSFET 560 functions as an electronic switch according to a PWM process. Electrical connection between the drain 530 and the source 550 is turned ON or OFF by a voltage signal on the gate 540 which comes from the pre-driver circuit 500.

The battery 600 serves as an electric energy source for applying electrical voltage and current to the glow plug 360. The voltage source V_GATE supplies electricity to the pre-driver circuit 500 for its operation. The pre-driver circuit 500 controls the gate 540 of the MOSFET 560 such that electric energy flow from the battery 600 can be shut off or turned on, preferably with an adjustable duty cycle. When the MOSFET 560 is closed, the glow plug 360 is turned on (on state of the glow plug), vice versa when the MOSFET 560 is open, the glow plug 360 is turned off (off state of the glow plug).

The pre-driver circuit 500 further includes a first switch SW1 and a second switch SW2, wherein the first switch SW1 may be used to bypass a first current generator 610 and the second switch SW2 may be used to bypass a second current generator 620. More specifically, in the pre-driver circuit 500, the first current generator 610 is arranged between a feeding node 605 and a first intermediate node 615, wherein the first switch SW1, in a closed position, connects the feeding node 605 with the first intermediate node 615, bypassing the first current generator 610. In a similar fashion, the second current generator 620 is arranged between a second intermediate node 625 and ground node 635, wherein the second switch SW2, in a closed position, connects the intermediate node 625 with the ground node 635, bypassing the second current generator 620.

The pre-driver circuit 500 further includes a logic unit 630, a resistor 640 and a ground terminal 650. The pre-driver circuit 500 can be advantageously implemented on in-house developed electronic control unit (ECU) via an ASIC or a discrete component, using a small silicon area.

Figure 4:
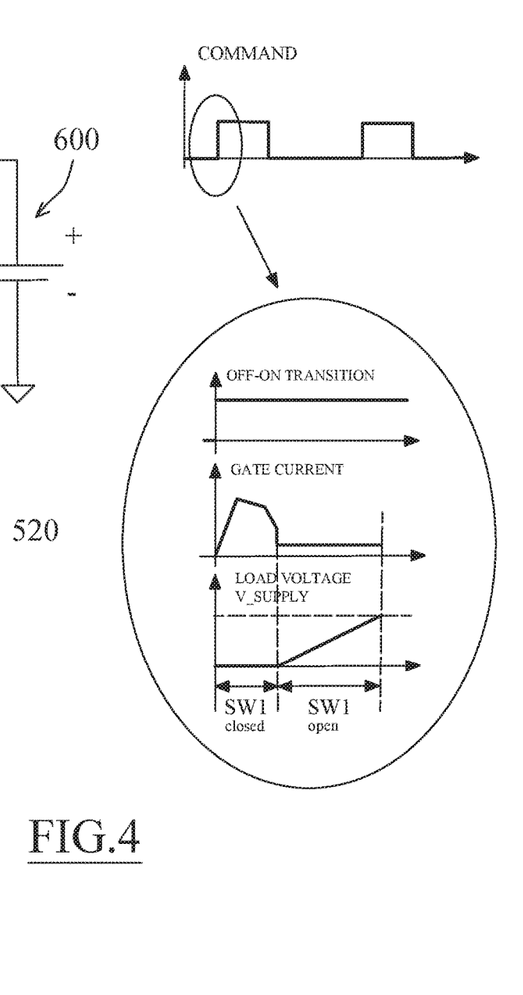
FIG. 4 represents the main variables of the circuit of FIG. 3 as a function of time in an OFT-ON transition.
Figure 7:
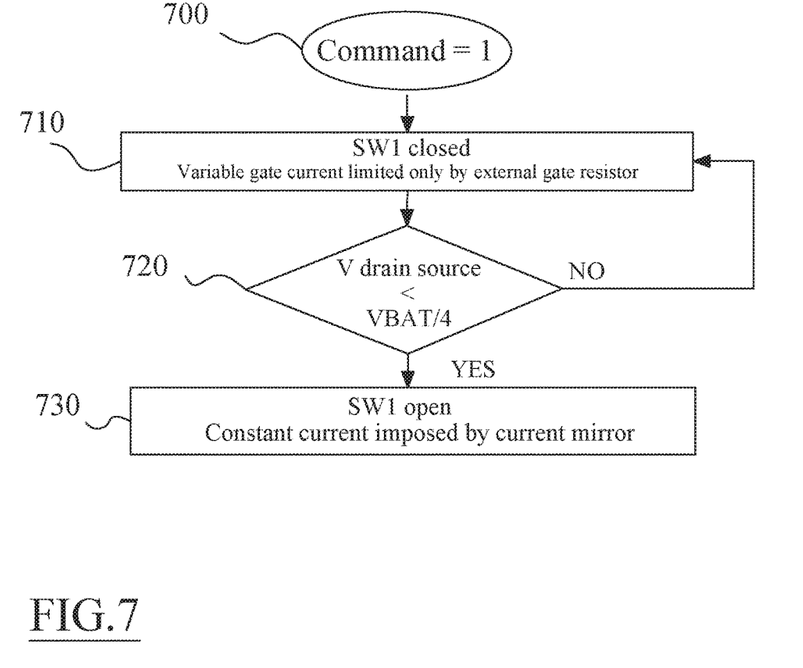
FIG. 7 represents an OFF-ON transition flowchart.

In operation, as stated above, the MOSFET 560 is operated under a PWM process, namely by means of a series of ON-OFF pulses or, in other words, by a series of state transitions, namely OFF-ON and ON-OFF transitions. FIG. 4 represents the main variables of the circuit of FIG. 3 as a function of time in an OFF-ON transition and, correspondingly, FIG. 7 represents an OFF-ON transition flowchart. According to an embodiment of the present disclosure, the OFF-ON transition is performed in the following way.

A command for a transition from the OFF state of the MOSFET to the ON state is given to the logic unit 630, as indicated with Command=1 in block 700 of the flowchart of FIG. 7. This command has also the effect of closing the first switch SW1 and applying a variable current to the gate 540 of the MOSFET 560, the current maximum value being limited only by the resistor 640 in the pre-driver circuit 500.

As soon as the drain-source MOSFET voltage reaches a value that is lower than a threshold voltage thereof (block 720), the first switch SW1 is opened and the first current generator 610, acting as a current mirror, provides a constant current to the gate 540 of the MOSFET 560 (block 730). The threshold voltage may be a function of the battery voltage VBAT, for example having the value of VBAT/4.

The first step employing a variable current ensures a small propagation delay and the second step employing a constant current ensures a slow increase of the voltage provided to the glow plug in order to avoid EMC problems.

Figures 5, 6:
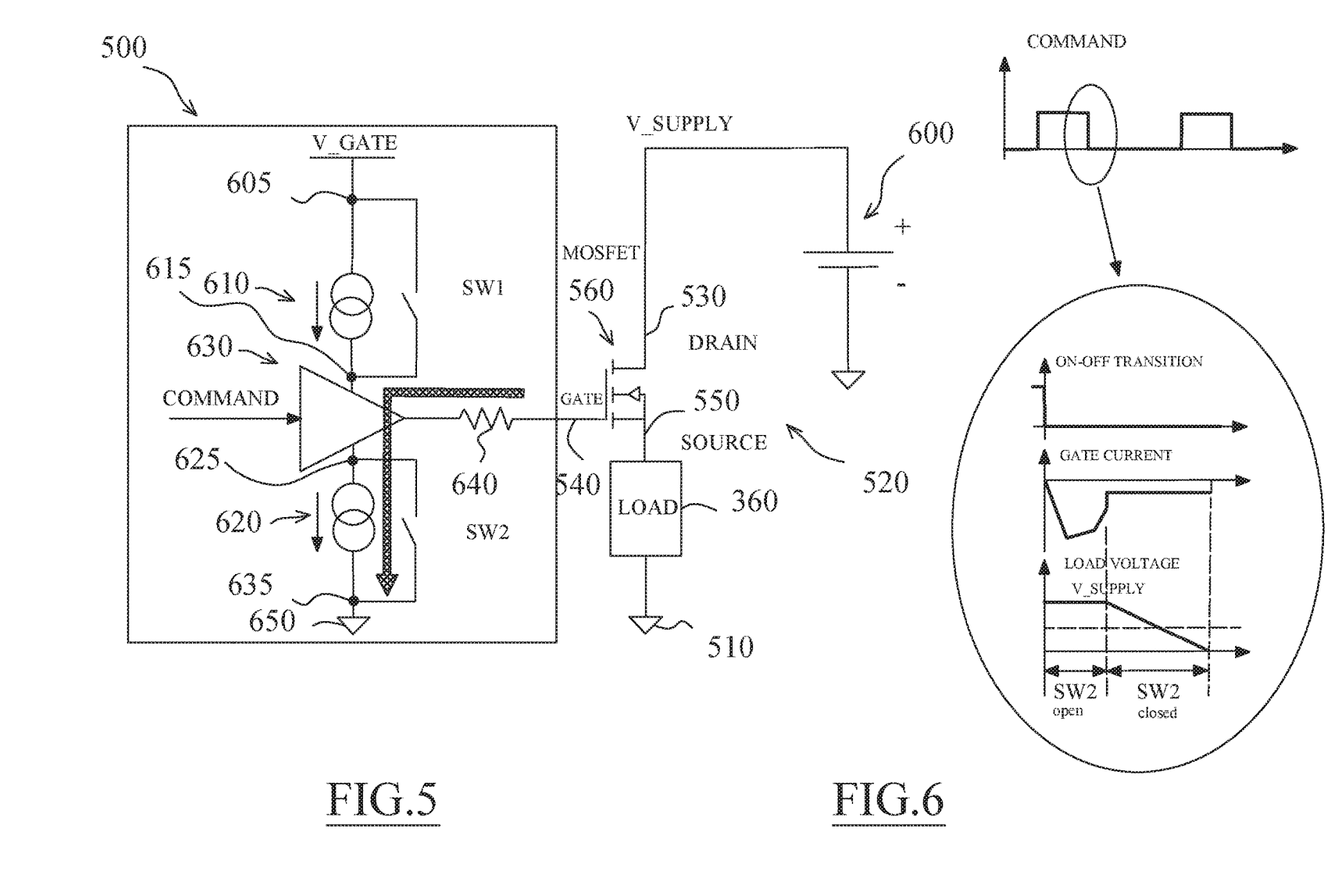
FIG. 5 is a schematic of a circuit for a MOSFET used to supply an electrical load in an ON-OFF transition.
FIG. 6 represents the main variables of the circuit of FIG. 5 as a function of time in an ON-OFF transition.
Figure 8:
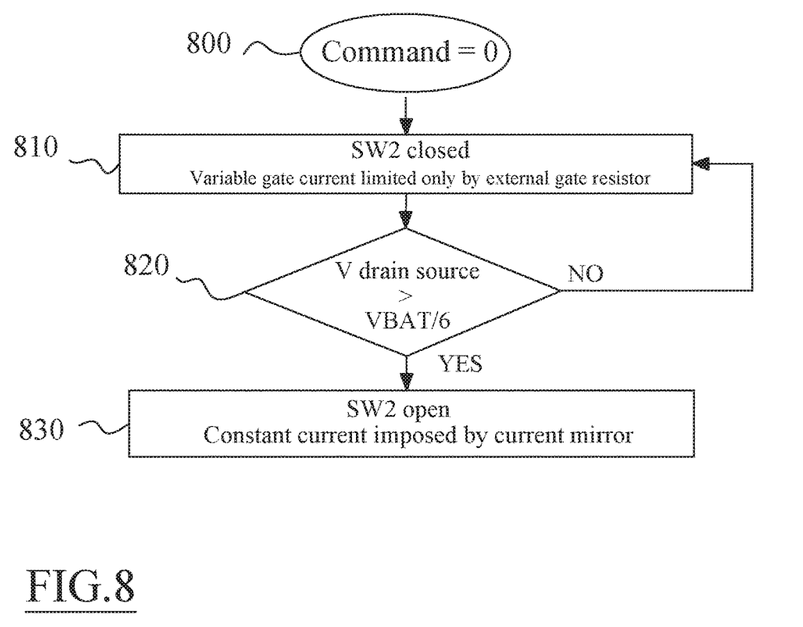
FIG. 8 represents an ON-OFF transition flowchart.

FIG. 6 represents the main variables of the circuit of FIG. 5 as a function of time in an ON-OFF transition and, correspondingly. FIG. 8 represents an ON-OFF transition flowchart. According to an embodiment of the present disclosure, the ON-OFF transition is performed in the following way.

A command for transition from the ON state of the MOSFET to the OFF state is given to the logic unit 630, as indicated with Command=0 in block 800 of the flowchart of FIG. 8. This command has also the effect of closing the first switch SW2, providing a variable current to the gate 540 of the MOSFET 560, the current maximum value being limited only by the resistor 640 in the pre-driver circuit 500.

As soon as the drain-source MOSFET voltage reaches a value that is greater than a threshold voltage thereof (block 820), the second switch SW2 is opened and the second current generator 610, acting as a current mirror, absorbs a constant current from the gate 540 of the MOSFET 560 (block 730). In this case, the threshold voltage may also be a function of the battery voltage VBAT, for example having the value of VBAT/6.

The first step employing a variable current ensures as al propagation delay and the second step employing a constant current ensures a slow reduction of the voltage provided to the glow plug in order to avoid EMC problems. In general, in all embodiments discussed, a constant current through the gate 540 of the MOSFET 560 is provided if the drain-source voltage of the MOSFET satisfies a predefined condition that is a function of a battery voltage.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment, it being understood that various changes may be made in the function and arrangement of elements described in an exemplary embodiment without departing from the scope of the invention as set forth in the appended claims and their legal equivalents.

What is claimed is:

1. A method of controlling a slew rate of a MOSFET connected to a battery for supplying an electrical current to an electrical load, the method comprising:
   determining a state transition of the MOSFET;
   monitoring a drain-source voltage of the MOSFET;
   applying a variable current through a gate of the MOSFET; and
   applying a constant current through the gate of the MOSFET once the drain-source voltage of the MOSFET satisfies a predefined condition that is a function of a battery voltage of the battery.

2. The method according to claim 1, wherein the predefined condition satisfied is that the drain-source voltage of the MOSFET is less than a first threshold voltage that is a function of the battery voltage when the state transition is an OFF-ON transition of the MOSFET.

3. The method according to claim 2, wherein the first threshold voltage is equal to one-fourth of the battery voltage.

4. The method according to claim 2, further comprising applying the constant current with a first current generator connected to the gate of the MOSFET in an OFF-ON transition of the MOSFET.

5. The method according to claim 4, further comprising closing a first switch to bypass the first current generator when applying the variable current through the gate of the MOSFET.

6. The method according to claim 1, wherein the predefined condition satisfied is that the drain-source voltage of the MOSFET is greater than a second threshold voltage that is a function of the battery voltage when the state transition is an ON-OFF transition of the MOSFET.

7. The method according to claim 6, wherein the second threshold voltage is equal to one-sixth of the battery voltage.

8. The method according to claim 7, applying the constant current through the gate of the MOSFET with a second current generator connected to the gate of the MOSFET in an ON-OFF transition of the MOSFET.

9. The method according to claim 8, further comprising closing a second switch to bypass the second current generator when applying the variable current through the gate of the MOSFET.

10. An apparatus for controlling a slew rate of a MOSFET connected to a battery for supplying an electrical current to an electrical load, the apparatus comprising:
    a sensor circuit configured to sense a state transition of the MOSFET;
    a monitoring circuit configured to monitor a drain-source voltage of the MOSFET;
    a pre-driver circuit configured to provide a variable current through a gate of the MOSFET and, once the drain-source voltage of the MOSFET satisfies a predefined condition, provide a constant current through the gate of the MOSFET, the predefined condition being that is a function of a battery voltage of the battery.

11. The apparatus according to claim 10, wherein the pre-driver circuit further comprises a first current generator arranged between a feeding node and a first intermediate node.

12. The apparatus according to claim 11, further comprising an external gate resistor, wherein the pre-driver circuit further comprises a first switch configured to bypass the first current generator, in a closed position, and wherein the pre-driver circuit is configured to provide the variable current with the first switch in the closed position with the variable current is limited only by the external gate resistor.

13. The apparatus according to claim 10, wherein the pre-driver circuit further comprises a second current generator arranged between a second intermediate node and a ground node.

14. The apparatus according to claim 13, wherein the pre-driver circuit further comprises a second switch configured to bypass the second current generator in a closed position, and wherein the pre-driver circuit is configured to provide the variable current with the first switch in the closed position with the variable current limited only by the external gate resistor.

15. The apparatus according to claim 10, wherein the electrical load comprises a glow plug for a Diesel engine.

16. An apparatus for controlling a slew rate of a MOSFET connected to a battery for supplying an electrical current to an electrical load, the apparatus comprising:
    a sensor circuit configured to sense a state transition of the MOSFET;
    a monitoring circuit configured to monitor a drain-source voltage of the MOSFET;
    a pre-driver circuit that comprises a first current generator, a first switch, a second current generator, and a second switch, the first switch and the second switch being switchable, respectively, between an open position and a closed position;

the first current generator arranged between a feeding node and a first intermediate node, and the first switch, in the closed position, configured to bypass the first current generator;

the second current generator arranged between a second intermediate node and a ground node, and the second switch, in the closed position, configured to bypass the second current generator, the pre-driver circuit configured to, in a first time period, provide a variable current through a gate of the MOSFET with one of the first switch and the second switch in the closed position, the drain-source voltage monitored by the monitoring circuit failing to satisfy a predefined condition that is a function of a battery voltage of the battery during the first time period; and the pre-driver circuit configured to, in a second time period that is subsequent the first time period, provide a constant current through the gate with the one of the first switch and the second switch in the open position, the drain-source voltage monitored by the monitoring circuit satisfying the predefined condition during the second time period.

17. The apparatus according to claim 16, wherein the predefined condition satisfied is that the drain-source voltage of the MOSFET is less than a first threshold voltage that is a function of the battery voltage when the state transition is an OFF-ON transition of the MOSFET;

wherein the pre-driver circuit is configured to, in the first time period, provide the variable current with the first switch in the closed position; and wherein the pre-driver circuit is configured to, in the second time period, provide the constant current with the first switch in the open position.

18. The apparatus according to claim 17, wherein the first threshold voltage is equal to one-fourth of the battery voltage.

19. The apparatus according to claim 16, wherein the predefined condition satisfied is that the drain-source voltage of the MOSFET is greater than a second threshold voltage that is a function of the battery voltage when the state transition is an ON-OFF transition of the MOSFET;

wherein the pre-driver circuit is configured to, in the first time period, provide the variable current with the second switch in the closed position; and wherein the pre-driver circuit is configured to, in the second time period, provide the constant current with the second switch in the open position.

20. The apparatus according to claim 19, wherein the second threshold voltage is equal to one-sixth of the battery voltage.

* * * * *